United States Patent [19]

Suzuki et al.

[11] Patent Number: 4,885,656
[45] Date of Patent: Dec. 5, 1989

[54] DIGITAL PROTECTIVE RELAY

[75] Inventors: Sunao Suzuki; Wataru Kayamori, both of Hyogo, Japan

[73] Assignee: Mitsubishi Denki Kabushiki Kaisha, Tokyo, Japan

[21] Appl. No.: 248,932

[22] Filed: Sep. 26, 1988

[30] Foreign Application Priority Data

Dec. 28, 1987 [JP] Japan .................................. 62-333434

[51] Int. Cl.$^4$ ............................................ H02H 3/253
[52] U.S. Cl. ....................................... 361/86; 361/94; 364/483
[58] Field of Search ....................... 361/91, 86, 93–97; 364/481, 483

[56] References Cited

U.S. PATENT DOCUMENTS 4,631,625 12/1986 Alexander et al. .................... 361/94
4,672,501 6/1987 Bilac et al. ........................... 361/96
4,774,621 9/1988 Andow .................................. 361/86

FOREIGN PATENT DOCUMENTS 58-51315 3/1983 Japan .

OTHER PUBLICATIONS

Japan Electric Society, "Protective Relay Engineering", p. 112, Jul. 20, 1981.

Primary Examiner—Todd E. DeBoer
Attorney, Agent, or Firm—Bernard, Rothwell & Brown

[57] ABSTRACT

In a digital protective relay, the amplitude value calculation is performed using three sampling values and the calculation result is obtained at high speed, and even if the frequency is varied the calculation is performed with high accuracy. Thereby performance of the digital protective relay can be significantly improved.

3 Claims, 3 Drawing Sheets

DIGITAL PROTECTIVE RELAY

BACKGROUND OF THE INVENTION

1. Field of the Invention

The present invention relates to a digital protective relay which responds to amplitude values of electric quantity such as AC voltages, AC current or the like in an electric power system, and more particularly to improvement of frequency characteristics of such relay.

2. Description of the Prior Art

FIG. 1 is a diagram illustrating the principle of a digital processor of AC electric quantity in the prior art disclosed, for example, in Japanese patent application laid-open No. 58-51315, where sampling is performed every 90° electric angle of AC current, and eight data are used and their amplitude values are estimated. In FIG. 1, numerals 1-8 designate sampling values of AC current, numerals 9-16 designate square arithmetic means, numeral 17 designates an adding arithmetic means for estimating the total of results of the square arithmetic means 9-16, numeral 18 designates a dividing arithmetic means for performing division by four, and numeral 19 designates a root arithmetic means for calculating the root of the output value of the dividing arithmetic means 18 and output $F_n$ of the root arithmetic means 19 becomes the amplitude value of current to be estimated.

Next, operation of the digital processor will be described. For convenience of the description, it is assumed that the AC electric quantity is AC current, the maximum value is I, the instantaneous value is i, the fundamental frequency is $f_o$, and the sampling period is T. Also in order to provide distinct data per sampling time, nT (n=0, 1, 2, ..., and n=0 is made a prescribed time) is made suffix, and data are expressed as i(0), i(T), i(2T), ... i(mT). Consequently, when eight data are used, formula (1) applies.

$$F_n^2 = \tfrac{1}{4}\{i^2(0) + i^2(T) + i^2(2T) + \ldots i^2(7T)\} = \quad (1)$$

$$\tfrac{1}{4} I^2 \{\sin^2(\theta) + \sin^2(\theta - T) + \sin^2(\theta - 2T) +$$

$$\ldots + \sin^2(\theta - 7T)\} =$$

$$\tfrac{1}{8} I^2 \{1 - \cos(2\theta) + 1 - \cos(2\theta - 2T) + 1 -$$

$$\cos(2\theta - 4T) + \ldots + 1 - \cos(2\theta - 14T)\} =$$

$$\tfrac{1}{8} I^2 [8 - 2 \{\cos(T) + \cos(3T) + \cos(5T) +$$

$$\cos(7T)\} \cdot \cos(2\theta - 7T)] =$$

$$I^2 \{1 - \cos(T) \cdot \cos(2T) \cdot \cos(4T) \cdot \cos(2\theta - 7T)\}$$

$$\therefore F_n = I \{1 - \cos(T) \cdot \cos(2T) \cdot \cos(4T) \cdot \cos(2\theta - 7T)\}^{\tfrac{1}{2}}$$

The sampling period T is fixed to intervals corresponding to 90° with respect to the fundamental frequency $f_o$ of the AC current, and becomes as formula (2) if the frequency is f.

$$T = \frac{f}{f_o \times 4} \times 360° \quad (2)$$

For example, if the frequency of the AC current is $f = f_o = 50$ Hz, the sampling period becomes T=90°.

In general, since the power system is operated at the rated frequency $f_o$, formula (1) becomes $F_n = I$ and amplitude calculation of current becomes possible and is utilized as an AC overcurrent protective relay for example. For the protective relay to detect fault of the power system, however, since the frequency at the fault generating state is frequently varied from $f_o$, the amplitude value must be estimated accurately even if the frequency is slightly shifted. Usually for the variation of frequency of about ±5%, the error of the amplitude value must be made as small as possible.

If the frequency becomes f=52.5 Hz (increase of 50 Hz by 5%), the period becomes T=94.5° and substituting this to formula (1) it follows that $$F_n = I\{1 + 0.0737 \cos(2\theta - 661.5°)\}^{\tfrac{1}{2}} \quad (3)$$

Consequently, a definite value is superposed by oscillation waveform of double frequency. Since the term $\cos(2\theta - 661.5°)$ can be varied to $+1.0 \sim -1.0$, it follows that $$F_n = 0.962I \sim 1.036I \quad (4)$$

Consequently, the error of $-3.8\% \sim +3.6\%$ is generated in comparison to the amplitude value calculation at the rated frequency 50 Hz.

Since the digital operation processor is constituted as above described, the amplitude value calculation error is relatively large when the frequency is varied about ±5%. Also since the eight sampling values are used, the time until outputting of the results must be that corresponding to $90° \times 8 = 720°$. Further, since data of large amount are used, the memory amount required for the calculation processing becomes large.

SUMMARY OF THE INVENTION

In order to eliminate the above-mentioned problems, an object of the invention is to provide a digital protective relay where the calculation processing is performed at high speed using small sampling values, and the amplitude value calculation error can be made small when the frequency is varied.

In the digital protective relay according to the invention three sampling values are used, and the first~third sampling values are squared respectively and only the squared value of the second sampling value is doubled and the total is obtained; thereby the amplitude value is calculated.

The foregoing and other objects and advantages of the invention will be apparent from the following detailed description of embodiments referring to the accompanying drawings.

PREFERRED EMBODIMENT OF THE INVENTION

Figure 1:
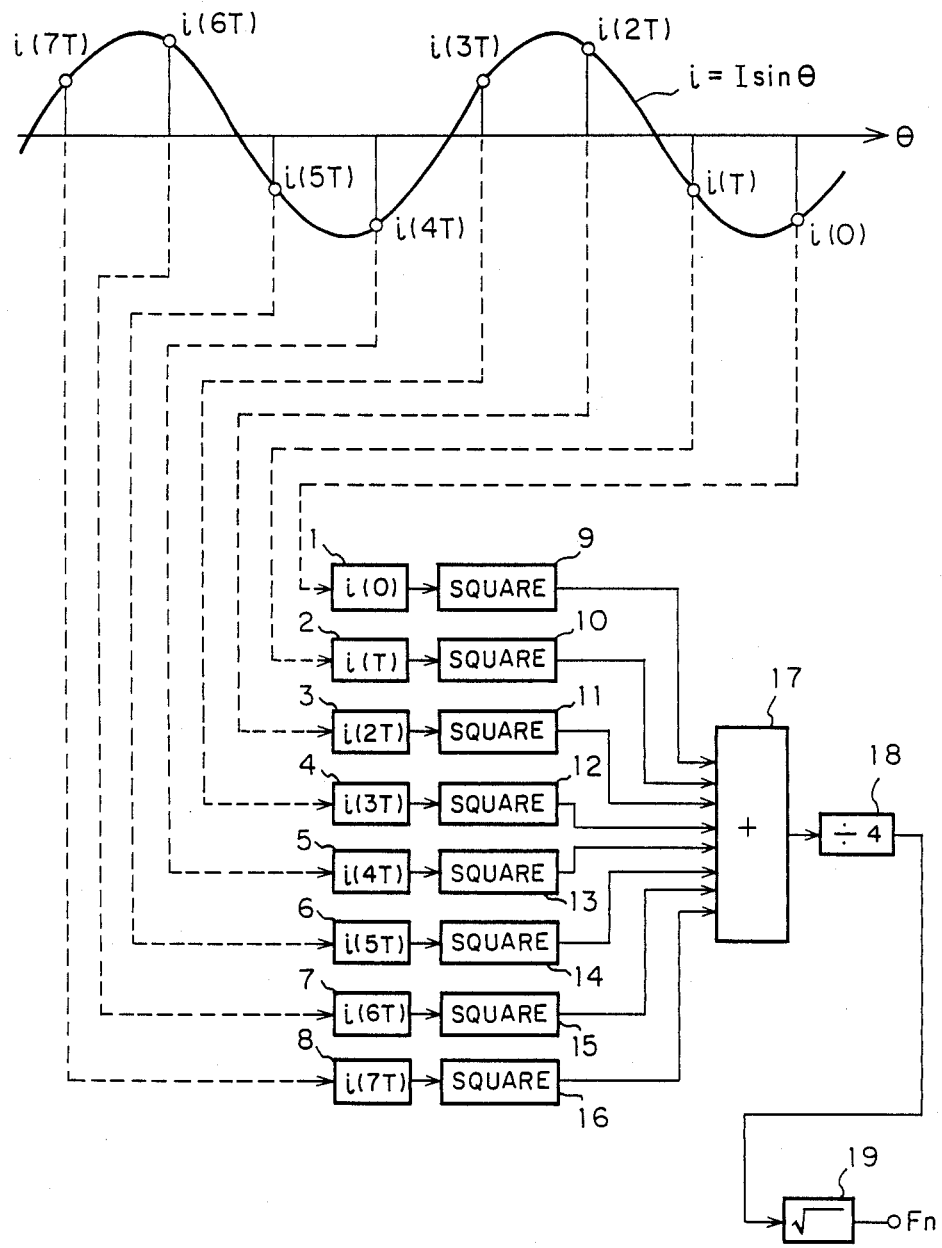
FIG. 1 is a block diagram illustrating an amplitude value calculating means in the prior art.
Figure 2:
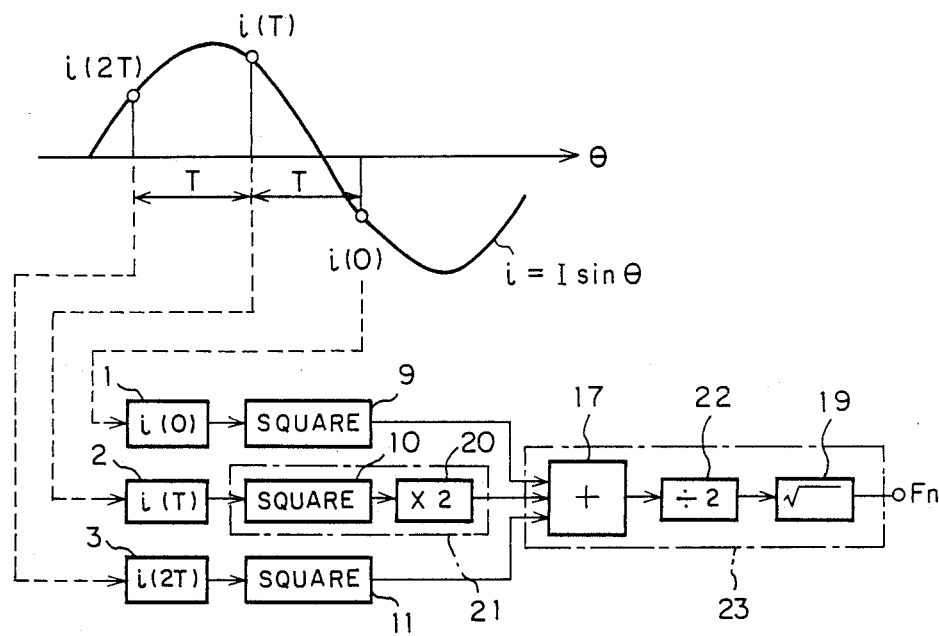
FIG. 2 is a block diagram illustrating the principle of an amplitude value calculating means according to an embodiment of the invention.

An embodiment of the invention will now be described referring to the accompanying drawings. In FIG. 2, a sampling value 1 at a prescribed time is made i(0), a sampling value 2 before one period (T) is made i(T) and a sampling value 3 before two periods (2T) is made i(2T), and respective sampling values 1~3 are squared by square calculating means 9~11 and only the result of the square calculating means 10 is doubled by a double calculating means 20.

Results obtained in the square calculating means 9 and 11 and the double calculating means 20 are added by an adding means 17; thereby the total is obtained and divided by two in a dividing calculating means 22 and its root is estimated in a root calculating means 19.

This is expressed by formula (5) as follows.

$$F_n = [\tfrac{1}{2}\{i^2(0) + 2\,i^2(T) + i^2(2T)\}]^{\tfrac{1}{2}} = \quad (5)$$

$$[\tfrac{1}{2} I^2 \{\sin^2(\theta) + 2\sin^2(\theta - 2T) + \sin^2(\theta - 2T)\}]^{\tfrac{1}{2}} =$$

$$\tfrac{1}{4} I \{1 - \cos(2\theta) + 2 - 2\cos(2\theta - 2T) + 1 -$$

$$\cos(2\theta - 4T)\}^{\tfrac{1}{2}} =$$

$$\tfrac{1}{4} I \{4 - 2\cos(2T)\cdot\cos(2\theta - 2T) - 2\cos(2\theta - 2T)\}^{\tfrac{1}{2}} =$$

$$I[1 - \tfrac{1}{2}\{1 + \cos(2T)\}\cdot\cos(2\theta - 7T)]^{\tfrac{1}{2}}$$

$$\therefore F_n = 1[1 - \tfrac{1}{2}\{1 + \cos(2T)\}\cdot\cos(2\theta - 2T)]^{\tfrac{1}{2}}$$

If the frequency becomes f=52.5 Hz (increase of 50 Hz by 5%), the period becomes 94.5° and substituting this to formula (5) it follows that $$F_n = I\{1 - 0.0062\cos(2\theta - 189°)\}^{\tfrac{1}{2}} \quad (6)$$

Consequently, a definite value is superposed by oscillation waveform of double frequency. Since the term cos (2θ−189°) can be varied +1.0~−1.0, it follows that $$F_n = 0.9971 \sim 1.0031 \quad (7)$$

Consequently, the error of −0.3%~+0.3% is generated in comparison to the amplitude value calculation at the rated frequency 50 Hz.

Although not shown, the amplitude value calculation result $F_n$ obtained here is compared by a fifth calculating means with a prescribed value (also called setting value) in amount and thereby fault of the power system is detected. This is a digital protective relay.

Although the output of the adding means 17 is processed by the dividing calculating means 22 and the root calculating means 19 in the above description, if the prescribed value (setting value) is set to a squared value, the root calculating means 19 may be obviated. Also if the prescribed value (setting value) is set to a squared and doubled value, the dividing calculating means 22 and the root calculating means 19 may be obviated. Thereby a digital protective relay can be implemented similarly to the above description. The square calculating means 9 is a first calculating means, and the square calculating means 11 is a third calculating means. The square calculating means 10 and the double calculating means 20 constitute a second calculating means 21, and the adding means 17, the dividing calculating means 22 and the root calculating means 19 constitute a fourth calculating means 23.

Variation state of the amplitude value calculation result $F_n$ when the frequency is varied will now be described referring to FIG. 3.

When ratio of the frequency f after variation and the rated frequency $f_o$ is represented by m=F/$f_o$, formula (8) is obtained from formula (5).

$$F_n = I[1 - \tfrac{1}{2}\{1 + \cos(2T)\}\cdot\cos(2\theta - 2T)]^{\tfrac{1}{2}} \quad (8)$$

$$= I[1 - \tfrac{1}{2}\{1 + \cos(180° \times m)\}\cdot$$

$$\cos(2\theta - 180° \times m)]^{\tfrac{1}{2}}$$

Figure 3:
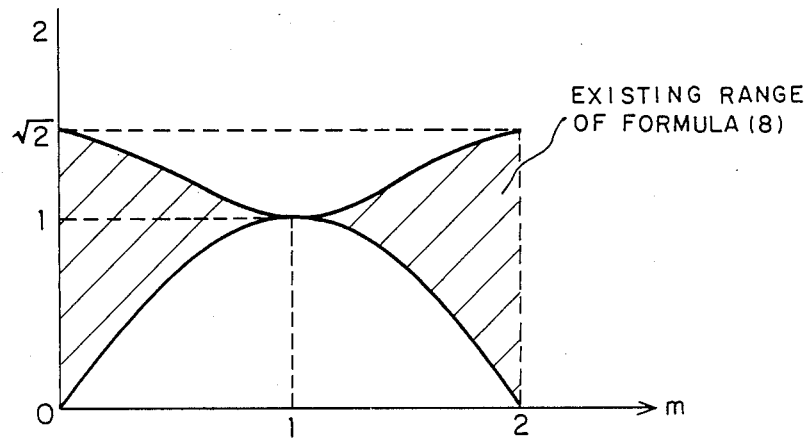
FIG. 3 is a diagram illustrating frequency characteristics of the amplitude value calculation results obtained by the calculating means of the invention.

When m in formula (8) is varied and illustrated, hatched portion in FIG. 3 is obtained and it is seen that little variation exists near portion of m=1 (f=$f_o$) and the error of the amplitude value calculation result becomes minimum.

Since the sampling values to be used in the amplitude value calculation can be implemented by three sampling values including the sampling value at the prescribed time, the result can be obtained at the time corresponding to 90°×3=270°. Consequently, high speed of $\tfrac{3}{4}$ times in comparison to the prior art can be implemented, and the memory amount necessary for the calculation processing may be reduced to $\tfrac{3}{4}$.

Figure 4:
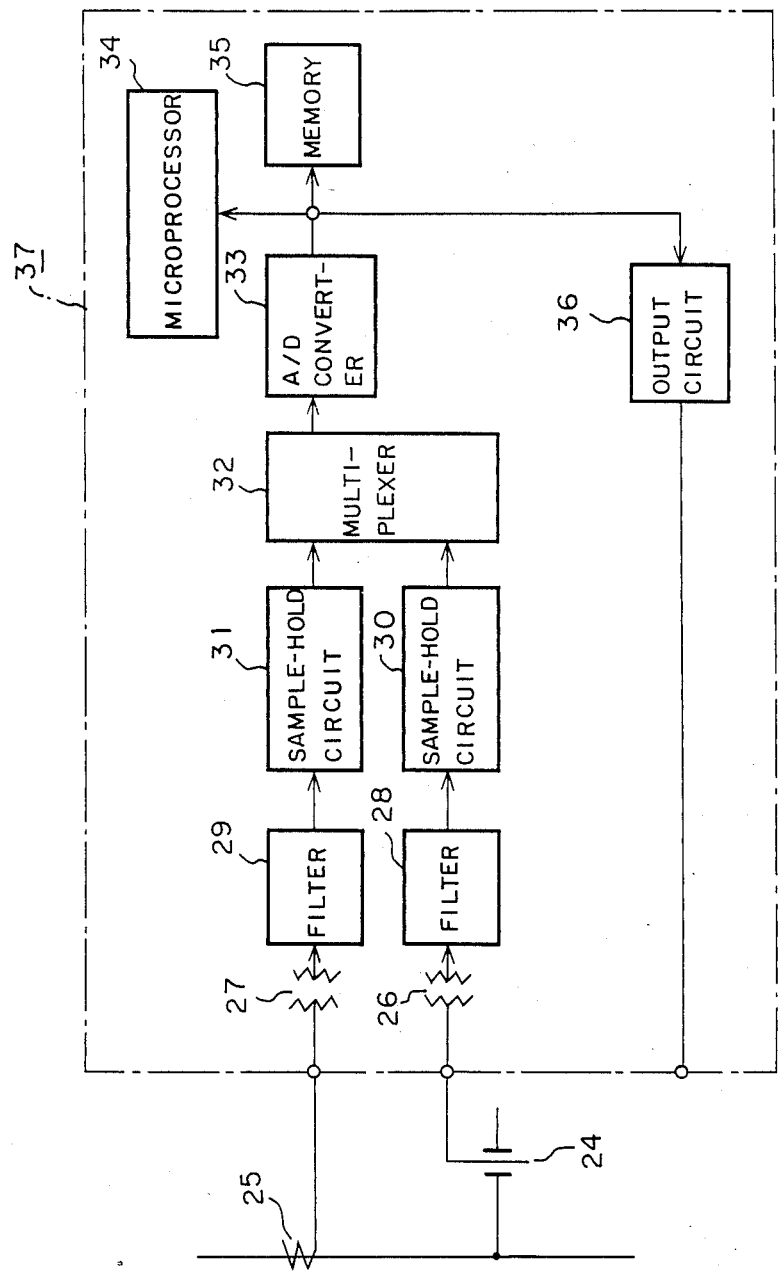
FIG. 4 is a block diagram illustrating hardware constitution of a digital protective relay implementing the calculating means of the invention.

FIG. 4 is a hardware constitution diagram of a digital protective relay 37 to implement the amplitude value calculation. In FIG. 4, numeral 24 designates a voltage transformer, numeral 25 designates a current transformer, numerals 26, 27 designate input converters which convert voltage and current to the power system into values to be easily processed, and numerals 28, 29 designate filters which eliminate frequencies of $\tfrac{1}{2}$ or more of the sampling frequency. Numeral 30, 31 designate sample-hold circuits which hold the sampling value until next sampling period. Numeral 32 designates a multiplexer which changes outputs of the sample-hold circuits 30, 31 in sequence and transmits them to an analog/digital converter 33. Numeral 34 designates a microprocessor which executes operation of the contents shown in FIG. 2 utilizing a program previously stored in a memory 35, and outputs the result to an output circuit 36. Numeral 37 designates a digital protective relay.

In the embodiment, although the description is directed to estimating the amplitude value of AC current, the AC current may be phase current of the power system or line current, or a symmetrical component obtained from the phase current or the line current, that is, positive-phase current, negative-phase current or zero-phase current with similar effects.

Further, AC voltage may be also applied with similar effects.

As above described, according to the invention, three sampling values are used continuously, and respective sampling values are squared and only the second squared value is doubled and the total is obtained, thereby even if the frequency of AC electric quantity is varied about ±5% the amplitude value can be calculated accurately and the calculation result can be obtained at high speed.

What is claimed is:

1. A digital protective relay, wherein instantaneous value of an AC electric quantity is sampled every 1/4 period of the period in the rated frequency of the AC electric quantity and converted into a digital value, and then operation processing is performed so as to detect a fault in the power system, said relay comprising:

a first calculating means for calculating square value of the digital value at a prescribed time;

a second calculating means for estimating square value of the digital value before or after the 1/4 period from the prescribed time and for performing double calculating of the square value;

a third calculating means for calculating square value of the digital value before or after the 2/4 period from the prescribed time;

a fourth calculating means for estimating the total of the calculation results calculated by said first, second and third calculating means, for dividing the total value by two, and for estimating a root thereof; and a fifth calculating means for comparing the calculation result of said fourth calculating means with a prescribed value.

2. A digital protective relay as set forth in claim 1, wherein said fourth calculating means estimates the total of said first, second and third calculating means, and divides the total value by two, and the root of the divided value obtained in the fourth calculating means is estimated by a root calculating means.

3. A digital protective relay as set forth in claim 1, wherein said fourth calculating means estimates the total of said first, second and third calculating means, and the total value obtained in the fourth calculating means is divided by two in a dividing calculating means, and the root of the divided value obtained in the dividing means is estimated by a root calculating means.

* * * * *